(12) United States Patent
Knittel

(10) Patent No.: US 7,924,679 B2
(45) Date of Patent: Apr. 12, 2011

(54) HOLOGRAPHIC SYSTEM, IN PARTICULAR FOR HOLOGRAPHIC DATA STORAGE

(75) Inventor: Joachim Knittel, Tuttlingen (DE)

(73) Assignee: Thomson Licensing, Boulgne-Billancourt (FR)

( * ) Notice: Subject to any disclaimer, the term of this patent is extended or adjusted under 35 U.S.C. 154(b) by 723 days.

(21) Appl. No.: 11/664,802

(22) PCT Filed: Sep. 13, 2005

(86) PCT No.: PCT/EP2005/054548
§ 371 (c)(1),
(2), (4) Date: Apr. 5, 2007

(87) PCT Pub. No.: WO2006/040231
PCT Pub. Date: Apr. 20, 2006

(65) Prior Publication Data
US 2009/0175148 A1  Jul. 9, 2009

(30) Foreign Application Priority Data
Oct. 13, 2004 (DE) .......................... 10 2004 050 068

(51) Int. Cl.
*G11B 7/00* (2006.01)
(52) U.S. Cl. ..................................... 369/103; 369/112.26
(58) Field of Classification Search .................. None
See application file for complete search history.

(56) References Cited

U.S. PATENT DOCUMENTS

| 6,137,752 | A | 10/2000 | Sakai |
| 2002/0041561 | A1 | 4/2002 | Tsukamoto et al. |
| 2002/0085250 | A1 | 7/2002 | Kim et al. |
| 2003/0025955 | A1 | 2/2003 | Curtis |
| 2003/0039001 | A1 | 2/2003 | King et al. |
| 2003/0147328 | A1 | 8/2003 | Horimai et al. |
| 2005/0002311 | A1* | 1/2005 | Ichihara et al. ............... 369/103 |
| 2005/0226120 | A1 | 10/2005 | Nishiwaki et al. |

FOREIGN PATENT DOCUMENTS

| EP | 0291184 | 11/1988 |
| EP | 1310952 | 5/2003 |
| JP | 01204220 | 8/1989 |
| JP | 07006401 | 1/1995 |
| JP | 11133842 | 5/1999 |

OTHER PUBLICATIONS

Search Report Dated Jan. 4, 2006.

* cited by examiner

*Primary Examiner* — Christopher R Lamb
(74) *Attorney, Agent, or Firm* — Robert D. Shedd; Jeffrey M. Navon

(57) ABSTRACT

In order, in the case of a holographic system, in particular for holographic data storage, comprising a radiation source for emission of a radiation an objective lens, a signal evaluation means, a detector and an optical data storage medium, the optical data storage medium having at least one data carrier layer and at least one beam-reflecting layer, to provide a solution which forms a small, compact and robust unit, in the case of which the signal beam crosses the reference beam only once, which avoids the use of optical beam splitters and requires a minimal alignment outlay, it is proposed that the objective lens has a plurality of sections, at least two beams that run parallel passing through the objective lens in a respective section and the at least two beams focusing at respectively separate locations on a plane in the optical data storage medium, at least one beam reflected in the optical data storage medium passing through the objective lens again in a respective further section.

11 Claims, 2 Drawing Sheets

HOLOGRAPHIC SYSTEM, IN PARTICULAR FOR HOLOGRAPHIC DATA STORAGE

Figure 1:
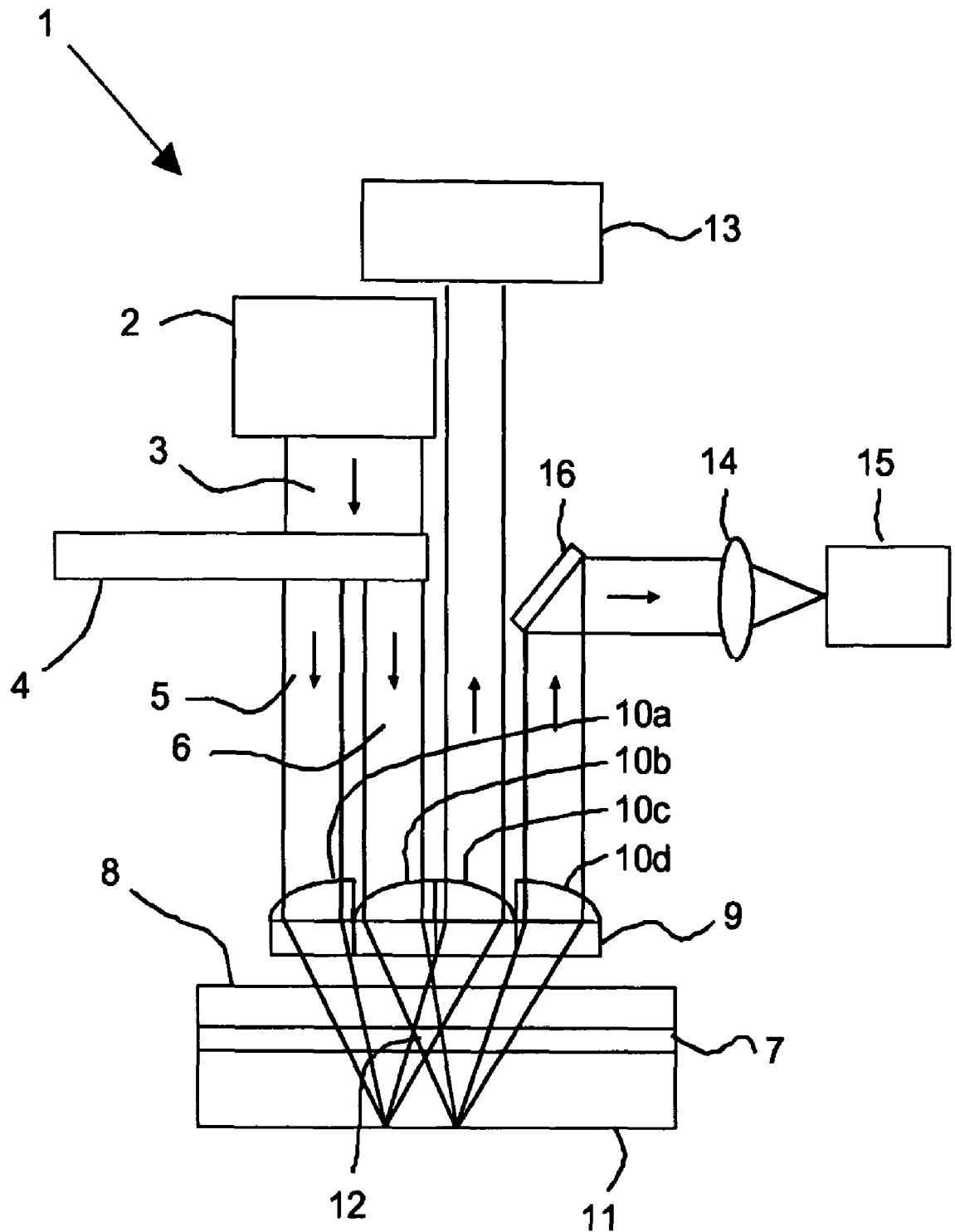

This application claims the benefit, under 35 U.S.C. §365 of International Application PCT/EP05/054548, filed Sep. 13, 2005, which was published in accordance with PCT Article 21(2) on Apr. 20, 2006 in English and which claims the benefit of German patent application No. 102004050068.1, filed Oct. 13, 2004.

The invention relates to a holographic system, in particular for holographic data storage, comprising a radiation source for emission of a radiation, an objective lens, a signal evaluation means, a detector and an optical data storage medium, the optical data storage medium having at least one data carrier layer and at least one beam-reflecting layer.

Systems of this type are usually used in the storage and in the read-out of items of information which are stored in digital media. Digital storage media may be CDs or DVDs, for example, which are widely available commercially. The constantly rising demand for the availability of large volumes of information requires fast and reliable storage and reading methods. Items of information which can be stored in the storage medium may generally be digital or analog. In this case, the digital data may be written and read out for example as two- or three-dimensional bit patterns. In this case, the data to be stored are written to the data carrier layer with the aid of a beam that is generated by means of a radiation source and modulated in accordance with the data information, in which case the individual information referred to as a bit can subsequently be read out again.

In order to increase the data storage capacity further, use may be made of holographic data storage, which involves applying the items of information three-dimensionally in the optical data storage medium.

Holographic data are stored and read out in the form of data pages each comprising a complete bit pattern. Such a bit pattern can be stored holographically and subsequently be read out and acquired as often as desired. The technique of so-called multiplexing additionally makes it possible for a multiplicity of data pages to be superposed at one location. The acquisition of the items of information comprises recording and reading out the optical information items contained in the signal beam. The acquired items of information can be converted into electrical signals with the aid of a digital camera or a CCD camera, for example, or be subjected to optical further processing.

The data bit pattern to be generated is impressed on the signal beam by means of a modulator during holographic data storage. As a result of interference between a signal beam and a reference beam, the data are written holographically to the optical storage medium at a predetermined angle. The holographic materials employed in this case may be crystals or comprise a multiplicity of partial crystals combined to form a unit, or organic or inorganic photorefractive materials, such as photopolymers, for example, which change their refractive index or their absorption coefficient as a result of exposure.

For the generation of the signal and reference beams, the prior art exhibits systems for the holographic storage and read-out of digital information items stored in bit sequences which comprise two individual radiation sources whose radiation is separated by means of polarizers and correspondingly collimated again for a superposition.

As disclosed in the document "Realization of 1 terabyte optical disc, OPTWARE Co. pamphlet obtained at Interopto '02 in Markuhari", the radiation sources in most applications are laser beam sources which either have beam paths that are completely separate from one another before the beams are brought to interference in the storage medium, or whose beams are separated by means of polarization filters in order subsequently to be crossed for interference in the storage medium. The required radiation sources may be laser sources, therefore, but their description with regard to the coherence of the characteristic radiation is not to be understood as a restriction to optical radiation.

For controlling the write and read head in its position with respect to the optical storage medium, use is made of a position regulating system in which, by means of a beam reflected in the storage medium, the focus and track control is performed by means of a detector.

In the case of the known writing and reading apparatuses for the holographic storage and read-out of digital information items from optical data storage media, the problem occurs that the optical construction of the writing and reading unit comprises a very complex system. Beam splitters such as polarization filters are likewise necessary, and the beams usually run on different optical paths as far as the common collimation or as far as the interference. This complex optical construction requires a high assembly and alignment outlay since a plurality of optical components have to be oriented in relation to one another. An essential precondition for writing and reading out the items of information in the case of systems of this type is very precise orientation and positioning of the two corresponding beams.

Likewise, the use of light-polarizing optical components exhibits disadvantages such that the separation—referred to as extinction—of the planes of polarization of the individual beams by means of the corresponding polarizers has instances of unsharpness, whereby the signal sharpness is attenuated further.

It is an object of the present invention to provide a holographic system, in particular for holographic data storage, which forms a small, compact and robust unit, in the case of which the signal beam crosses the reference beam in the holographic storage layer only once, which avoids the use of optical beam splitters and requires a minimal alignment outlay.

Proceeding from a system for holographic data storage in accordance with the preamble of claim 1, this object is achieved in conjunction with the characterizing features of claim 1. Advantageous developments of the invention are specified in the dependent claims.

The invention includes the technical teaching that the objective lens or the objective lens system has a plurality of sections, at least two beams that run parallel passing through the objective lens in a respective section and the at least two beams focussing at respectively separate locations on a plane in the optical data storage medium, at least one beam reflected in the optical data storage medium passing through the objective lens again in a respective further section.

This solution affords the advantage that the signal beam can run parallel together with the reference beam through the objective lens according to the invention, whereby it is possible to dispense with beam-splitting optics, in particular ones based on polarization, in the course of the beam. Consequently, the disadvantages of lower signal sharpness no longer occur since the extinction ratio, which describes the contrast of non-100% separation of the planes of polarization, always brings about an unsharpness in the digital signal.

The parallel course of the two beams makes it possible to realize a compact system which is small in its construction and which, besides only one radiation source, can be constructed with a small number of further optical components.

A further measure that improves the invention provides for the objective lens or the objective lens system to comprise precisely four sections, the sections being formed in such a way that precisely two beams passing through the objective lens cross at precisely one crossover point. This affords the advantage that the two beams cross only once in the data layer and generate a clearly defined hologram layer there. In this case, the individual sections of the objective lens are arranged in relation to one another such that the crossover between the signal beam and the reference beam is brought about by means of the specially interleaved course of the beams.

According to one possible development of the system, it is proposed that the sections of the objective lens or objective lens system are in each case shaped as a half-lens, the objective lens having a horizontally bilaterally symmetrical or a rotationally symmetrical form, the curvatures of the half-lenses pointing outwards. With the half-lens-shaped contour of the individual sections of the objective lens, the signal beam and the reference beam pass through the optical data storage medium at an angle. This effects the single crossover of the two beams. The beams are focussed as a result of the curvature in the half-lens-shaped contour, which means that a separate objective for focussing the beams can be obviated. The advantageous embodiment of the objective lens according to the invention thus performs both the function of beam deflection and the function of focussing.

For the splitting and the modulation of the collimated beam emitted by the radiation source, it is particularly advantageous that a modulation means is arranged between the radiation source and the objective lens, the modulation means generating precisely two parallel beams from the collimated laser beam emitted by the radiation source, one beam serving as a signal beam and one beam serving as a reference beam. In the simplest form, the modulation means permits one half of the laser beam to pass unimpeded as a reference beam, while the other half of the laser beam is modulated in accordance with the data to be stored. The modulation means alters the amplitude and/or the phase of the incident laser beam. It goes without saying that it is likewise possible for the modulation means to have a beam splitter optic. By modulating the reference beam, the modulation means may furthermore be utilized for phase coding multiplexing. Besides the function of beam splitting, the modulation means additionally performs the function of beam modulation in order to enable phase coded multiplexing for the holographic data storage. The modulation means is preferably a spatial light modulator (SLM), for example a liquid crystal arrangement or a micro-mirror array.

For constructional reasons, it is particularly advantageous if the reference beam can be utilized for regulating the focus and track position and the inclination (disc tilt) of the optical data storage medium. Preferably, the reference beam passes through an astigmatic focussing lens downstream of the objective lens and is then detected by a detector in order to generate a correction signal for the regulation. In this case, the objective lens is received mechanically by an actuator means in order to perform a focus, disc tilt and track control on the basis of the correction signal. The detector is a four-quadrant diode, for example, in order to detect a deviation of the reference beam both from the focus position and from the track. In this case, the astigmatic focussing lens serves for beam shaping and comprises a non-rotationally symmetrical lens. Instead of the astigmatism method, it is likewise possible to use other methods, such as e.g. the so-called "spot size detection" method, for generating a correction signal. What is advantageous about this solution is the capability of utilizing the reference signal, which is collimated after once again passing through the objective lens and can be forwarded into the detector as a free beam. The actuator means, which can move the objective lens relative to the optical data storage medium, makes it possible to perform positional corrections on the objective lens and thus to readjust the focus position, the disc tilt and the track. In this case, the correction signal for the actuator means is detected by the detector and conditioned, whereby the abovementioned components form a closed control loop.

An additional measure that improves the invention provides for the angle between the mutually crossing beams at the crossover point in the data carrier layer of the optical data storage medium to be 90°. The advantage of this measure is that, with an angle of 90° between the signal beam and the reference beam, the phase coded multiplexing has an optimum function, that is to say that a very high storage density can be obtained. It goes without saying, however, that the angle may also assume other values, preferably between 80° and 100°. In real systems, the angle is at least partly determined by the lens design.

For an evaluation of the signal beam, the signal beam enters a signal evaluation means arranged downstream of the objective lens in order to acquire signals contained in the signal beam. After the acquisition of the data, the latter can be conditioned and made presentable by being converted into electrical signals. In this case, the signal evaluation means may comprise a CCD camera or a photoarray, a parallel evaluation of a plurality of data being possible. An optical further processing of the data is likewise possible in order to make them available for further optical applications.

Figure 2:
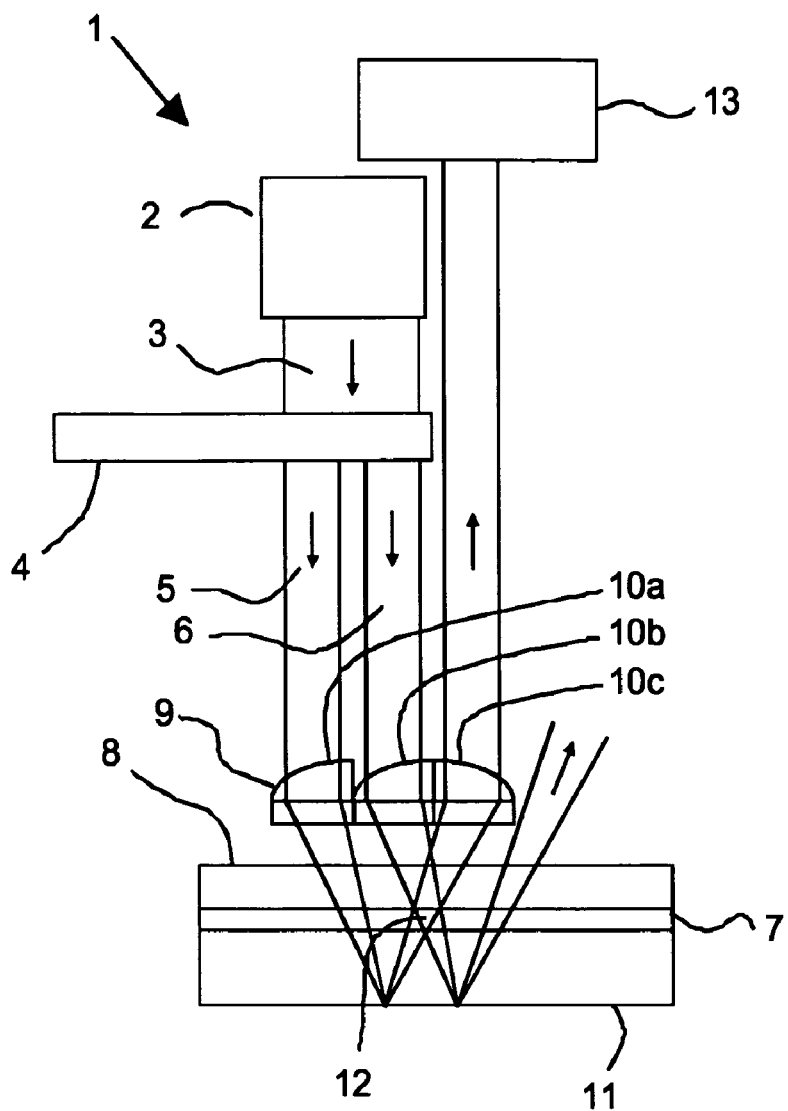
Figure 3:
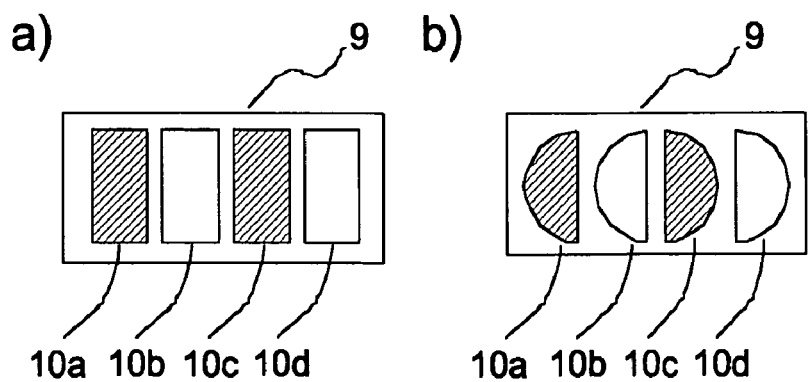

Further measures that improve the invention are specified in the subclaims or are illustrated in more detail below jointly with the description of the preferred exemplary embodiment of the invention with reference to the figures, in which:

FIG. 1 shows a schematic illustration of the construction of a holographic system with a detector, FIG. 2 likewise shows a schematic illustration of a construction of the holographic system, but with a modified objective lens and without a detector, and FIG. 3 shows a schematic plan view of the objective lens.

The accompanying figures are schematic illustrations and serve for elucidating the invention. Identical and similar components are represented by identical reference symbols. The indications of direction relate to the plane of the drawing unless specified otherwise. The angle between the beams is distinctly different from 90° in the figures. This results from the greatly enlarged illustration of the data carrier in comparison with the other elements.

The construction of a holographic system 1 illustrated in FIG. 1 comprises a radiation source 2, which emits a radiation 3. In this case, the radiation source 2 may be a laser beam source that emits a collimated laser beam that impinges on a modulation means 4. The collimated laser beam is subsequently split into a signal beam 5 and a reference beam 6, which run parallel to one another, in the modulation means 4. The signal beam 5 is modulated by the modulation means 4 in accordance with the bit pattern to be written to a data carrier layer 7 of an optical data storage medium 8. In this case, the reference beam 6 may additionally be modulated by the modulation means 4 for phase coded multiplexing. The modulator 4 normally lies in the focal plane of the lens. Each pixel of the modulator generates a plane wave (Fourier transformation property of a lens) in the data carrier. During the phase modulation, the phases of the individual plane waves are varied, typically shifted either by 0 or Pi. Through skilful selection of the individual phases, it is possible to store a plurality of holograms at the same location.

The two beams 5, 6 running parallel are subsequently directed onto an optical data storage medium 8 by an objective lens 9 and focussed in the optical data storage medium 8 in the process. The objective lens 9 has four sections 10a, 10b, 10c, 10d each having a half-lens-shaped contour on the upper side situated in the direction of the radiation source 2. The objective lens may be configured as bilaterally symmetrical or rotationally symmetrical, one side of the objective lens 9 having the half-lens-shaped contours and the other side being plane. Consequently, the sections are planoconvex lenses placed individually against one another, the curvature of the half-lens-shaped contour of the four sections 10a, 10b, 10c, 10d in each case pointing outwards. In this case, the objective lens 9 may be embodied in one piece or be composed of the individually produced sections 10a, 10b, 10c, 10d. The planoconvex lenses that are depicted only schematically here may, of course, be replaced by biconvex aspherical lenses or even lens systems in order to improve the imaging properties of the objective lens. As a result of the refraction of the signal beam 5 and of the reference beam 6 at the objective lens 9, the two beams enter the optical data storage medium 8 at an angle that differs from 90°. The optical data storage medium has a beam-reflecting layer 11 below the data carrier layer 7, the signal beam 5 and the reference beam 6 being reflected at said beam-reflecting layer, so that they return in the opposite direction again in the optical data storage medium 8 at an angle of emergence corresponding to the angle of incidence.

The optical data storage medium 8 has at least one data carrier layer 7 situated parallel to the beam-reflecting layer 11 in the optical data storage medium 8. As a result of the curvature of the surface of the individual sections 10a, 10b, the two collimated beams 5, 6 are focussed on the beam-reflecting layer 11 and then cross at a crossover point 12 in the data carrier layer 7. As a result of the signal beam 5 crossing the reference beam 6, a hologram is generated in the data layer, which is composed e.g. of a photosensitive polymer. The information is stored in this volume grating. It can only be read out with the aid of the reference beam that was also used in the generation of the hologram. By varying the phase of the reference beam, it is possible to store a plurality of holograms at the same location (so-called phase multiplexing).

Once the two beams have passed through the optical data storage medium 8, they are once again collimated by the sections 10c, 10d of the objective lens 9 and radiate in a parallel manner in the opposite direction away from the objective lens 9. In this case, the signal beam passes into a signal evaluation means 13, which acquires the digital data and subsequently converts them into electrical signals. In this case, the signal evaluation means 13 may comprise a CCD camera or a photoarray, but an optical further processing is also possible, so that the signals may be forwarded in an optical fibre, by way of example. The reference beam 6, by contrast, is conducted into a detector 15 via an astigmatic lens or a special beam splitter 14. In this case, the astigmatic lens 14 is non-rotationally symmetrical, whereby the reference beam 6 can be evaluated for a position detection. The detector 15 may comprise a four-quadrant diode which can detect a deviation of the reference beam 6 from its desired position, whereby the detector 15 outputs a correction signal. If the position of the objective lens 9 deviates with respect to the optical data storage medium 8, so that either the focus position or else the track position of the two beams deviates from the desired position, then the reference beam 6 likewise migrates from its desired position, which is subsequently detected by the detector 15. Since the signal beam 5 and the reference beam 6 run parallel to one another, an erroneous position of the two beams can equally be detected and corrected solely by means of the detection of the reference beam 6. For the introduction both of the signal beam 5 and of the reference beam 6 into the signal evaluation means 13 and into the detector 15, use is made of mirrors 16 which additionally make the beams positionable with respect to the signal evaluation means 13 and with respect to the detector 15.

The correction signal supplied by the detector 15 is passed on to a mechanical actuator means within an active control loop in order subsequently to correct the position of the objective lens 9.

FIG. 2 likewise illustrates a schematic illustration of a construction of the holographic system, but with a modified objective lens 9 and without a detector 15. This system is similar to the system described in FIG. 1, but the detection of the reference beam 6 for beam position correction by means of a detector 15 is obviated. In this case, the focus and track position detection is performed by means of an external system comprising an additional laser beam source, by way of example. Since the recollimation of the reference beam 6 by means of the fourth section 10d of the objective lens 9 is not necessary in the case of this variant, this section is obviated, whereby the objective lens 9 is constructed from only three sections 10a, 10b, 10c.

FIGS. 3a) and b) schematically illustrate a plan view of two possible embodiments of the objective lens 9. In this case, FIG. 3a) shows a bilaterally symmetrical embodiment of the objective lens 9 and FIG. 3b) shows a rotationally symmetrical embodiment. In this case, the hatched areas designate the lens segments for the signal beam, and the non-hatched areas designate the lens segments for the reference beam.

The embodiment of the invention is not restricted to the preferred exemplary embodiment specified above. Rather, a number of variants are conceivable which make use of the solution illustrated also in the case of embodiments of fundamentally different configuration.

LIST OF REFERENCE SYMBOLS

1 Holographic system
2 Radiation source
3 Radiation
4 Modulation means
5 Signal beam
6 Reference beam
7 Data carrier layer
8 Optical data storage medium
9 Objective lens
10 Section
11 Beam-reflecting layer
12 Crossover point
13 Signal evaluation means
14 Astigmatic lens
15 Detector
16 Mirror

The invention claimed is:

1. An apparatus for reading from and writing to a holographic storage medium, having a single objective lens for focusing an object beam and a reference beam into the holographic storage medium, the object beam and a reference beam being parallel at a position of a front surface of the single objective lens, wherein the single objective lens has spatially separate sections, a first section being provided for focusing the object beam, a second section being provided for focusing the reference beam, and a third section being provided for collimating a reconstructed object beam.

2. The apparatus according to claim 1, wherein the objective lens has a fourth section for collimating a reflected reference beam.

3. The apparatus according to claim 1, wherein the sections of the objective lens are in each case shaped as a half-lens, the objective lens having a horizontally bilaterally symmetrical or a rotationally symmetrical form, the curvatures of the half-lenses pointing outwards.

4. The apparatus according to claim 1, wherein it includes a laser beam source that emits a collimated laser beam.

5. The apparatus according to claim 4, wherein a modulation means is arranged between the laser beam source and the objective lens, the modulation means generating precisely two parallel beams from the collimated laser beam emitted by the radiation source, one beam serving as the object beam and one beam serving as the reference beam.

6. The apparatus according to claim 5, wherein the modulation means modulates the reference beam for phase coded multiplexing.

7. The apparatus according to claim 4, wherein the reference beam is utilized for regulating the focus and/or track position and/or disc tilt.

8. A The apparatus according to claim 7, wherein the objective lens is received mechanically by an actuator means that is controllable by a correction signal in order to perform a focus, disc tilt and/or track control.

9. The apparatus according to claim 1, wherein the angle between the object beam and the reference beam at the crossover point in the data carrier layer of the holographic storage medium is 80° to 100°.

10. The apparatus according to claim 1, wherein a signal evaluation means is arranged downstream of the objective lens, on which signal evaluation means the reconstructed object beam impinges in order to acquire signals contained in the reconstructed object beam.

11. The apparatus according to claim 1, wherein the object beam crosses the reference beam within the holographic storage medium.

* * * * *